United States Patent
Erol et al.

(10) Patent No.: US 10,541,706 B2
(45) Date of Patent: Jan. 21, 2020

(54) DYNAMIC-ZOOM ANALOG TO DIGITAL CONVERTER (ADC) HAVING A COARSE FLASH ADC AND A FINE PASSIVE SINGLE-BIT MODULATOR

(71) Applicant: Arizona Board of Regents on behalf of Arizona State University, Scottsdale, AZ (US)

(72) Inventors: Osman Emir Erol, Chandler, AZ (US); Sule Ozev, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 15/990,013

(22) Filed: May 25, 2018

(65) Prior Publication Data
US 2019/0363730 A1    Nov. 28, 2019

(51) Int. Cl.
*H03M 3/00* (2006.01)
*H04B 1/40* (2015.01)

(52) U.S. Cl.
CPC ............. *H03M 3/32* (2013.01); *H03M 3/43* (2013.01); *H03M 3/438* (2013.01); *H03M 3/458* (2013.01); *H04B 1/40* (2013.01)

(58) Field of Classification Search
CPC .......... H03M 3/32; H03M 3/43; H03M 3/438; H03M 3/458
USPC ........................................................ 341/155
See application file for complete search history.

(56) References Cited

U.S. PATENT DOCUMENTS

| 6,803,827 | B1 * | 10/2004 | Kenney | H03L 7/107 331/1 A |
| 9,325,340 | B2 * | 4/2016 | Gonen | H03M 1/14 |
| 9,979,411 | B1 * | 5/2018 | Gupta | H03M 3/376 |
| 10,056,914 | B2 * | 8/2018 | Li | H03M 1/1023 |

(Continued)

OTHER PUBLICATIONS

Author Unknown, "The Mobile Economy 2017," GSMA Report, www.gsmaintelligence.com/research/?file=9e927fd6896724e7b26f33f61db5b9d5&download, 2017, GSM Association, 60 pages.

(Continued)

*Primary Examiner* — Brian K Young
(74) *Attorney, Agent, or Firm* — Withrow & Terranova, P.L.L.C.

(57) ABSTRACT

A dynamic-zoom analog to digital converter (ADC) having a coarse flash ADC and a fine passive single-bit modulator is disclosed. Radio frequency (RF) devices incorporating aspects of the present disclosure may support multiple wireless modes operating at different frequencies. Therefore, the RF devices have need for an ADC which is flexible and optimizable in terms of resolution, bandwidth, and power consumption. In this regard, the RF devices incorporate circuits, such as ADC circuits, which incorporate a discrete-time passive delta-sigma modulator. In order to improve the resolution of the delta-sigma modulator, a coarse ADC is deployed as a zooming unit to a single-bit passive delta-sigma modulator to provide a coarse digital conversion. Coarse conversion is used to dynamically update reference voltages at an input of the delta-sigma modulator using a multi-bit feedback digital to analog converter (DAC). The dynamic-zoom ADC supports multiple modes with improved power and quantization noise.

20 Claims, 6 Drawing Sheets

(56) References Cited

U.S. PATENT DOCUMENTS

| | | | |
|---|---|---|---|
| 10,135,459 B2* | 11/2018 | Sharma | A61B 5/04284 |
| 10,141,945 B2* | 11/2018 | Lye | H03M 1/1245 |
| 10,148,280 B2* | 12/2018 | Lee | H03M 1/462 |
| 10,243,578 B2* | 3/2019 | Dagher | H03M 1/1245 |

OTHER PUBLICATIONS

Benabes, Philippe, et al., "Passive Sigma-Delta converters design," IEEE Instrumentation and Measurement Technology Conference, May 2002, 6 pages.

Bettini, Luca, et al., "A Reconfigurable DT ΔΕ Modulator for Multi-Standard 2G/3G/4G Wireless Receivers," Journal on Emerging and Selected Topics in Circuits and Systems, vol. 5, Issue 4, Dec. 2015, IEEE, 12 pages.

Chae, Youngcheol., et al., "A 6.3 µW 20 bit Incremental Zoom-ADC with 6ppm INL and 1µV offset," Journal of Solid-State Circuits, vol. 48, Issue 12, Dec. 2013, IEEE, 32 pages.

Chen, Feng, et al., "A 1.5V mA 80dB Passive ΣΔ ADC in 0.13µm Digital CMOS Process," Solid-State Circuits Conference, Digest of Technical Papers, Feb. 2003, IEEE, 10 pages.

Chen, Feng, et al., "Design and analysis of a CMOS passive ΣΔ ADC for low power RF transceivers," Analog Integrated Circuits and Signal Processing, vol. 59, Issue 2, May 2009, pp. 129-141.

Christen, Thomas, et al., "A 0.13 CMOS EDGE/UMTS/WLAN tri-mode ADC with THD," Solid-State Circuits Conference, Digest of Technical Papers, Feb. 2007, 3 pages.

Crombez, Pieter, et al., "A Single-Bit 500 kHz-10 MHz Multimode Power-Performance Scalable 83-to-67 dB DR CTΔΣ for SDR in 90 nm Digital CMOS," IEEE Journal of Solid-State Circuits, vol. 45, Issue 6, Jun. 2010, pp. 1159-1171.

Ding, Ming, et al., "A 5.5fJ/conv-step 6.4MS/S 13b SAR ADC Utilizing a Redundancy-Facilitated Background Error-Detection-and-Correction Scheme," International Solid-State Circuits Conference, Digest of Technical Papers, Feb. 2015, IEEE, 3 pages.

Gonen, Burak, et al., "A Dynamic Zoom ADC with 109-dB DR for Audio Applications," Journal of Solid-State aircuits, vol. 52, Issue 6, Jun. 2017, IEEE, pp. 1542-1550.

Harpe, Pieter, et al., "A 2.2/2.7fJ/conversion-step 10/12b40kS/s SAR ADC with Data-Driven Noise Reduction," International Solid-State Circuits Conference, Digest of Technical Papers, Feb. 2013, IEEE, 3 pages.

Jabbaour, Chadi, et al., "A Delay Reduction Technique for DWA Algorithms," Transactions on Circuits and Systems, vol. 61, Issue 10, Oct. 2014, IEEE, 5 pages.

Karmakar, Shoubhik, et al., "A 280uW Dynamic-Zoom ADC with 120dB DR and 118dB SNDR in 1kHz BW," International Solid-State Circuits Conference, Session 14, Feb. 13, 2018, IEEE, 3 pages.

Ke, Yi, et al., "A 2.8-to-8.5 mW GSM/Bluetoot/UMTS/DVB-H/WLAN Fully Reconfigurable CTAΕ with 200kHz to 20 MHz BW for 4G radios in 90nm digital CMOS," Symposium on VLSI Circuits, Jun. 2010, IEEE, pp. 153-154.

Li, Jing, et al., "An Energy-Efficient 5-MHz to 20-MHz, 12-bit Reconfigurable Continuous-Time Modulator for 4G-LTE Application," International Symposium on Low Power Electronics and Design, Sep. 2013, IEEE, pp. 163-168.

Morgado, Alonso, et al., "A 100kHz-10 MHz BW, 78-to-52 dB DR, 4.6-to-11mW Flexible SC Modulator in 1.2-V 90-nm CMOS," Journal of Solid-State Circuits, Sep. 2010, IEEE, pp. 418-421.

Ouzounov, S., et al., "A 1.2V 121-Mode CT ΔΣModulator for Wireless Receivers in 90nm CMOS," International Solid-State Circuits Conference, Digest of Technical Papers, Feb. 2007, IEEE, 3 pages.

Quiquempoix, Vincent, et al., "A Low-Power 22-bit Incremental ADC," Journal of Solid-State Circuits, vol. 41, Issue 7, Jul. 2006, IEEE, pp. 1562-1571.

Song, Tongyu, et al., "A 2.7-mW 2-MHz Continuous-Time Δz Modulator With a Hybrid Active-Passive Loop Filter," Journal of Solid-State Circuits, vol. 43, Issue 2, Feb. 2008, IEEE, pp. 330-341.

Suarez, Ricardo, et al., "All-MOS Charge Redistribution Analog-to-Digital Conversion Techniques—Part II," Journal of Solid State Circuits, Dec. 1975, pp. 379-385.

Xu, Ken, et al., "A 10.2 mW multimode continuous-time DR ADC with 70-87 dB DR and 0.7-10 MHz bandwidth for TD-SCDMA and LTE digital receivers," Analog Integrated Circuits and Signal Processing, vol. 89, Issue 2, Nov. 2016, pp. 395-410.

\* cited by examiner

DYNAMIC-ZOOM ANALOG TO DIGITAL CONVERTER (ADC) HAVING A COARSE FLASH ADC AND A FINE PASSIVE SINGLE-BIT MODULATOR

FIELD OF THE DISCLOSURE

The technology of the disclosure relates generally to analog to digital converters (ADC), and more particularly to ADCs deployed in radio frequency (RF) devices.

BACKGROUND

Wireless communications systems and related networks, such as Universal Mobile Telecommunications Systems (UMTSs), are increasingly deploying Fourth Generation (4G), its offspring Long Term Evolution (LTE), and 5th Generation New Radio (5G-NR) described and being developed by the Third Generation Partnership Project (3GPP) to support higher data rates. At the same time, wireless communications systems continue to use older Second Generation (2G) and Third Generation (3G) modes throughout the world. In order to support multiple standards efficiently, mobile devices have need for programmable, low-power, low-cost, highly integrated transceivers compatible with the corresponding cellular technologies. Therefore, analog to digital converters (ADCs) used in such transceivers are also required to be flexible and optimizable in terms of resolution, bandwidth, and power consumption (depending upon the wireless communications standard or mode).

Delta-sigma modulator architecture has become a preferred ADC solution due to its easy re-configurability for better performance or less power consumption by changing an oversampling ratio (OSR) of an ADC circuit. The delta-sigma architecture is less dependent on analog component values and its noise shaping property helps attenuate a significant amount of quantization noise and out of band interferers.

Several continuous-time (CT) and discrete-time (DT) delta-sigma modulators have been proposed supporting multiple communications standards (e.g., modes of operation). While CT delta-sigma modulators have certain advantages over DT delta-sigma modulators, such as implicit anti-aliasing filtering and power efficiency, CT delta-sigma modulators are more prone to non-idealities such as clock jitter, excess loop delay, and integrator coefficient (RC time constant) variation which can be as high as ±%20. Furthermore, multi-mode CT delta-sigma modulators are more sensitive to parasitic effects and are more complex because CT loop filters are designed for a single operating clock frequency, and they need multiple switchable passive resistor-capacitor (RC) combinations in order to satisfy multi-mode operation. Comparatively, DT modulators are robust with respect to process variations as their transfer functions rely on capacitor ratios. Furthermore, multi-mode operation can be realized by adjusting clock frequency. However, active DT delta-sigma modulators consume much more power compared to their CT counterparts due to the use of operational transconductance amplifiers (OTAs) having higher unity gain bandwidth (UGBW) requirements. The UGBW of the OTAs used in active DT modulators needs to be much higher than the sampling frequency to ensure proper settling in switched capacitor integrators. Compared to active delta-sigma modulators, passive delta-sigma modulators provide lower power solutions for DT operation due to the elimination of power hungry OTAs. Nevertheless, the resolution of passive delta-sigma modulators can be limited due to limited options for reducing quantization noise power.

SUMMARY

Exemplary aspects of the present disclosure relate to a dynamic-zoom analog to digital converter (ADC) having a coarse flash ADC and a fine passive single-bit modulator. Radio frequency (RF) devices incorporating aspects of the present disclosure may support multiple communications standards (e.g., wireless modes) operating at different frequencies. Therefore, the RF devices have need for programmable, low-power, low-cost, highly integrated transceivers compatible with the multiple wireless modes. The transceivers include one or more ADCs which are also flexible and optimizable in terms of resolution, bandwidth, and power consumption.

In this regard, the RF devices according to the present disclosure incorporate one or more circuits, such as a dynamic-zoom ADC circuit, which incorporates a discrete-time (DT) delta-sigma modulator. In order to conserve power, the delta-sigma modulator is a passive DT delta-sigma modulator which avoids the use of operational transconductance amplifiers (OTAs). Traditionally, the resolution of passive delta-sigma modulators can be limited due to limited options for reducing quantization noise power. However, embodiments of the present disclosure deploy a coarse ADC as a zooming unit to a single-bit passive delta-sigma modulator to provide a coarse digital conversion. Coarse conversion is used to dynamically update reference voltages at an input of the delta-sigma modulator using a multi-bit feedback digital to analog converter (DAC). Therefore, similar to multi-bit quantizer-based delta sigma modulators, quantization noise power decreases and resolution of the delta-sigma modulator improves significantly.

In aspects disclosed herein, the dynamic-zoom ADC circuit includes a flash ADC as the coarse ADC, which serves as a zooming unit to the passive delta-sigma modulator. In one clock cycle the flash ADC can measure an input signal and set the zooming range of the dynamic-zoom ADC circuit by updating values of the feedback DAC coupled to the input of the delta-sigma modulator. Since feedback DAC values are updated every clock cycle, the input signal is maintained within zooming range independent of input signal frequency, ensuring the zooming function is not limited by an oversampling ratio (OSR) of the dynamic-zoom ADC circuit. As a result, the dynamic-zoom ADC circuit can support lower OSR values required for higher bandwidth modes and can support multiple wireless communications standards (e.g., multiple signal bandwidths).

In an exemplary aspect, an ADC circuit is provided. The ADC circuit includes a first analog input node and a flash ADC coupled to the first analog input node. The ADC circuit also includes a feedback DAC coupled to an output of the flash ADC and a delta-sigma ADC coupled to the first analog input node and coupled to an output of the feedback DAC. The ADC circuit also includes a digital output node coupled to the output of the flash ADC and coupled to an output of the delta-sigma ADC.

Another exemplary aspect relates to a circuit. The circuit includes a flash ADC configured to convert an analog input signal to a coarse digital signal and a delta-sigma ADC configured to provide a fine digital signal. The circuit also includes a feedback DAC coupled between the flash ADC and an input of the delta-sigma ADC and configured to reduce a quantization noise in the fine digital signal based on the coarse digital signal.

Another exemplary aspect relates to a method for converting an analog input signal to a digital output signal. The method includes receiving the analog input signal and converting the analog input signal to a coarse digital signal through a flash ADC circuit. The method also includes providing a feedback signal based on the coarse digital signal and converting the analog input signal to a quantized digital signal through a delta-sigma ADC circuit. The method also includes providing the digital output signal based on the coarse digital signal and the quantized digital signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
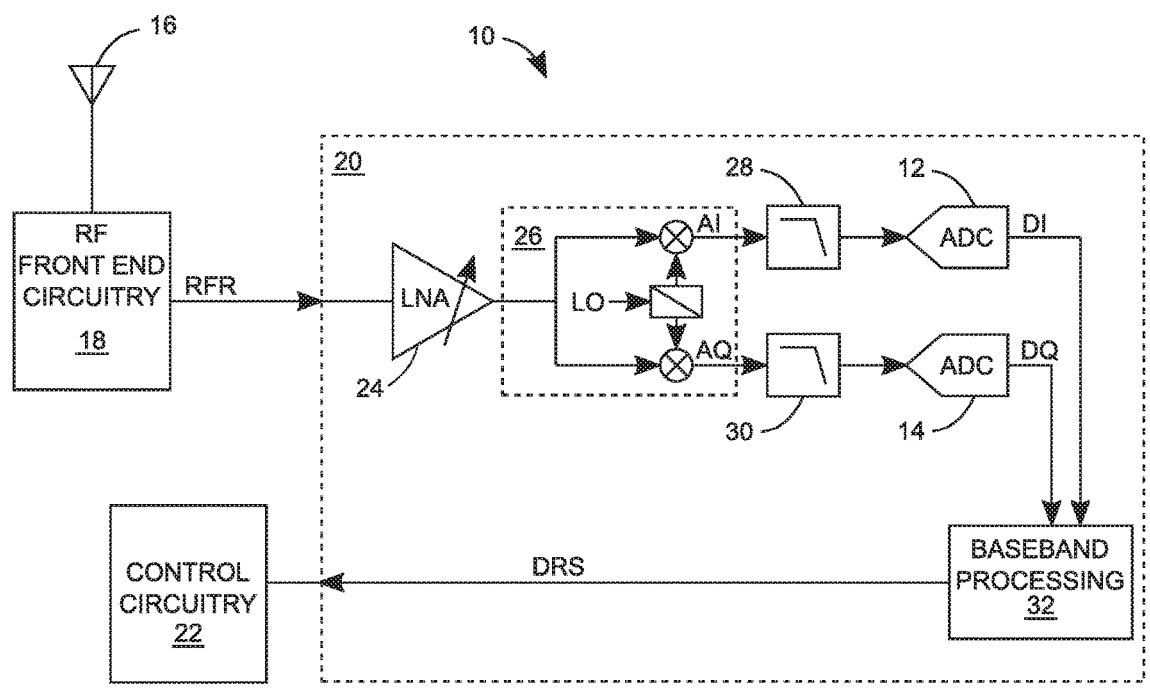
FIG. 1 depicts a schematic diagram of a radio frequency (RF) communications device incorporating an exemplary analog to digital converter (ADC) circuit which can be a dynamic-zoom ADC circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Exemplary aspects of the present disclosure relate to a dynamic-zoom analog to digital converter (ADC) having a coarse flash ADC and a fine passive single-bit modulator. Radio frequency (RF) devices incorporating aspects of the present disclosure may support multiple communications standards (e.g., wireless modes) operating at different frequencies. Therefore, the RF devices have need for programmable, low-power, low-cost, highly integrated transceivers compatible with the multiple wireless modes. The transceivers include one or more ADCs which are also flexible and optimizable in terms of resolution, bandwidth, and power consumption.

In this regard, the RF devices according to the present disclosure incorporate one or more circuits, such as a dynamic-zoom ADC circuit, which incorporates a discrete-time (DT) delta-sigma modulator. In order to conserve power, the delta-sigma modulator is a passive DT delta-sigma modulator which avoids the use of operational transconductance amplifiers (OTAs). Traditionally, the resolution of passive delta-sigma modulators can be limited due to limited options for reducing quantization noise power. However, embodiments of the present disclosure deploy a coarse ADC as a zooming unit to a single-bit passive delta-sigma modulator to provide a coarse digital conversion. Coarse conversion is used to dynamically update reference voltages at an input of the delta-sigma modulator using a multi-bit feedback digital to analog converter (DAC). Therefore, similar to multi-bit quantizer-based delta sigma modulators, quantization noise power decreases and resolution of the delta-sigma modulator improves significantly.

In aspects disclosed herein, the dynamic-zoom ADC circuit includes a flash ADC as the coarse ADC, which serves as a zooming unit to the passive delta-sigma modulator. In one clock cycle the flash ADC can measure an input signal and set the zooming range of the dynamic-zoom ADC circuit by updating values of the feedback DAC coupled to the input of the delta-sigma modulator. Since feedback DAC values are updated every clock cycle, the input signal is maintained within zooming range independent of input signal frequency, ensuring the zooming function is not limited by an oversampling ratio (OSR) of the dynamic-zoom ADC circuit. As a result, the dynamic-zoom ADC circuit can support lower OSR values required for higher bandwidth modes and can support multiple wireless communications standards (e.g., multiple signal bandwidths).

FIG. 1 depicts a schematic diagram of an RF communications device 10 incorporating one or more ADC circuits which can be dynamic-zoom ADC circuit(s) 12, 14. The RF communications device 10 includes an RF antenna 16, RF front end circuitry 18, RF receive circuitry 20, and control circuitry 22. The RF receive circuitry 20 includes the dynamic-zoom ADC circuit(s) 12, 14. The dynamic-zoom ADC circuit(s) 12, 14 incorporates a DT delta-sigma modulator. In order to conserve power, the delta-sigma modulator is a passive DT delta-sigma modulator. In addition, the dynamic-zoom ADC circuit(s) 12, 14 deploys a coarse ADC as a front end to the delta-sigma modulator to provide a coarse digital conversion. Coarse conversion is used to dynamically update reference voltages at an input of the delta-sigma modulator using a multi-bit feedback DAC, improving the resolution of the delta-sigma modulator. In an exemplary aspect, the dynamic-zoom ADC circuit(s) 12, 14 includes a flash ADC as the coarse ADC, which serves as a zooming unit to the delta-sigma modulator. In one clock cycle the flash ADC can measure an input signal and set the zooming range of the dynamic-zoom ADC circuit(s) 12, 14 by updating values of the feedback DAC coupled to the input of the delta-sigma modulator. Since feedback DAC values are updated every clock cycle, the input signal is maintained within zooming range independent of input signal frequency, ensuring the zooming function is not limited by an oversampling ratio (OSR) of the dynamic-zoom ADC circuit. As a result, the dynamic-zoom ADC circuit(s) 12, 14 can support lower OSR values required for higher bandwidth modes and can support multiple wireless communications standards (e.g., multiple signal bandwidths), as further described below with respect to FIGS. 3 and 4.

As depicted in FIG. 1, the RF front-end circuitry 18 receives via the RF antenna 16, processes, and forwards an RF receive signal RFR to the RF receive circuitry 20. The RF receive circuitry 20 further processes the RF receive signal RFR to provide a digital receive signal DRS to the control circuitry 22. In this regard, the RF receive circuitry 20 includes signal processing circuitry, such as a low noise amplifier (LNA) 24, quadrature mixing circuitry 26, one or more low pass filters 28, 30, the dynamic-zoom ADC circuit(s) 12, 14, and digital baseband processing circuitry 32. In some examples, additional conditioning and/or processing circuitry may be included in the RF receive circuitry 20.

The LNA 24 may include one or more amplification stages. Generally, the RF receive signal RFR has a lower amplitude, and the LNA 24 amplifies the RF receive signal RFR before the quadrature mixing circuitry 26 divides the signal into an analog in-phase signal AI and an analog quadrature signal AQ. The quadrature mixing circuitry 26 may operate according to an appropriate signal modulation scheme, such as quadrature amplitude modulation (QAM). After passing through the one or more low pass filters, 28, 30, the analog in-phase signal AI and the analog quadrature signal AQ are converted to digital through the dynamic-zoom ADC circuit(s) 12, 14. In the example depicted, the analog in-phase signal AI is converted to a digital in-phase signal DI through a first dynamic-zoom ADC circuit 12, while the analog quadrature signal AQ is converted to a digital quadrature signal DQ through a second dynamic-zoom ADC circuit 14. The digital in-phase signal DI and the digital quadrature signal DQ are processed through the digital baseband processing circuitry 32, and the digital receive signal DRS is forwarded to the control circuitry 22. The digital baseband processing circuitry 32 includes a decimation filter which is programmable based on the bandwidth mode of the ADO circuit 12. In some examples, the digital baseband processing circuitry 32 also includes digital signal processing algorithms required for proper receive signal operation such as automatic gain control and calibration algorithms. In other examples, the second dynamic-zoom ADC circuit 14 and/or components of the digital baseband processing circuitry 32 may be omitted (e.g., the first dynamic-zoom ADC circuit 12 may convert the analog in-phase signal AI and the analog quadrature signal AQ to the digital receive signal DRS).

In some embodiments of the RF front-end circuitry 18, the RF front-end circuitry 18 includes at least one RF switch, at least one RF amplifier, at least one RF filter, at least one RF duplexer, at least one RF diplexer, at least one RF amplifier, the like, or any combination thereof. In one embodiment of the control circuitry 22, the control circuitry 22 includes transceiver circuitry, which may include a transceiver integrated circuit, additional baseband controller circuitry, the like, or any combination thereof. The control circuitry 22 can also include circuitry to perform other processes of the RF communications device 10, such as high level communications and/or device processing.

Figure 2:
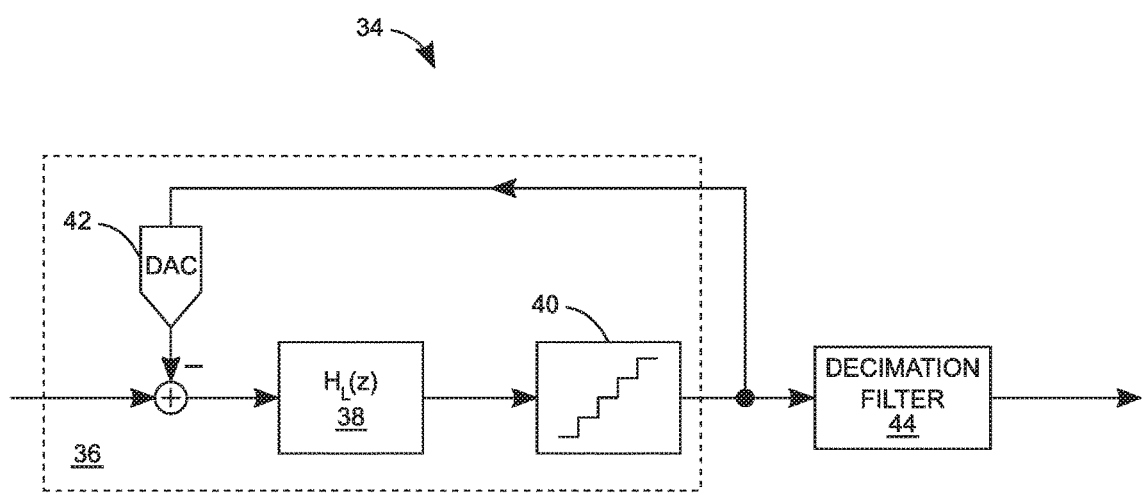
FIG. 2 depicts a schematic diagram of an ADC circuit incorporating an active delta-sigma modulator.

FIG. 2 depicts a schematic diagram of an ADC circuit 34, incorporating an active delta-sigma modulator 36. The delta-sigma modulator 36 incorporates circuitry to convert an analog input signal to a digital output signal, including a loop filter 38, a multi-bit quantizer 40, and a feedback DAC 42. The loop filter 38 can include one or more integrators which operate according to a transfer function $H_L(z)$ (e.g., a first-order, second-order, or higher-order loop filter depending on the number of integrators), while the quantizer 40 produces a multi-bit digital signal which is converted by a decimation filter 44 in the ADC circuit 34 into a higher resolution digital output signal. The feedback DAC 42 can be coupled to an output of the quantizer 40 to reduce quantization noise through a negative feedback added to the analog input signal.

For the active delta-sigma modulator 34, multiple techniques are used to reduce quantization noise and improve a signal to quantization noise ratio (SQNR), such as increasing loop filter 38 order, increasing OSR, and increasing quantizer 40 resolution. Traditionally, when a passive delta-sigma modulator is used in place of the active delta-sigma modulator 34, the resolution of the passive delta-sigma modulator can be limited due to limited options for reducing quantization noise power. In a passive delta-sigma modulator, the lack of gain in the loop filter (equivalent to loop filter 38) limits options for reducing quantization noise power. In a higher order active delta-sigma modulator 34, loop gain is distributed across multiple integrators in the loop filter 38. Comparatively, in a passive delta-sigma modulator, the quantizer (equivalent to quantizer 40) is the only gain source. Required gain is mostly provided by a higher gain preamplifier in the quantizer which needs to be scaled with increasing loop filter order in order to achieve an equivalent noise transfer function (NTF) with the active delta-sigma modulator 34. In addition, the preamplifier may need sufficient bandwidth (e.g., 3 decibels (dB)) to ensure loop stability. The higher gain-bandwidth and lower noise requirements of an ADC circuit for a wireless communications device may cause higher power consumption in the quantizer, diminishing the lower power consumption benefits of the passive delta-sigma modulator.

Moreover, in the higher order active delta-sigma modulator 34, only the noise contribution of a first integrator stage in the loop filter 38 may be significant. The noise introduced by later integrator stages can be attenuated by the gain provided by the first integrator stage. Therefore, increasing the loop filter 38 order does not introduce significant additional noise. In contrast, in a passive delta-sigma modulator, an increase of the loop filter order increases the number of passive elements, which are thermal noise sources. Since these passive elements are at an input of the quantizer, there is no attenuation and they directly affect a signal to noise ratio (SNR) of the delta-sigma modulator. Increasing the loop filter order creates a tradeoff between thermal and quantization noise contributions. Therefore, increasing the order of the loop filter beyond second order may provide a diminished return in terms of overall SNR while considerably increasing the power consumption. Unlike the active delta-sigma modulator 34, increasing quantizer resolution in a passive delta-sigma modulator can be difficult due to a small signal swing at the quantizer input. Thus, increasing the OSR is traditionally the primary efficient method to increase the SQNR of a passive delta-sigma modulator. Therefore, traditional passive delta-sigma architectures have been limited to applications with relatively narrow signal bandwidth and/or medium dynamic range requirements.

A zoom-ADC architecture has been previously presented for audio applications using a coarse five bit successive approximation register (SAR) ADC and a one bit active delta-sigma modulator, which are clocked at a same clock edge. Every five clock cycles, the SAR ADC yields a coarse conversion result and this coarse conversion is used to update the reference voltages of the delta-sigma modulator using a multi-bit DAC. While the previous SAR ADC may decrease quantization noise power, if the delta-sigma OSR value is not high enough, the input signal can move out of the zoom range of the SAR ADC during the five clock cycles required. In wireless communications devices (e.g., RF devices), this approach is undesirable due to lower OSR values due to wide bandwidth, lower power consumption requirements and/or technology driven constraints on maximum sampling frequency.

In contrast, in aspects disclosed herein, the ADC circuit is a dynamic-zoom ADC circuit 12 (see FIGS. 1 and 3) which includes a flash ADC to provide a coarse digital conversion. The dynamic-zoom ADC circuit 12 also includes a passive delta-sigma modulator operating concurrently with the flash ADC to provide higher resolution digital conversion. In one clock cycle the flash ADC can measure an input signal and set the zooming range of the dynamic-zoom ADC circuit 12 by updating values of a feedback DAC coupled to the input of the delta-sigma modulator. Since feedback DAC values are updated every clock cycle, the input signal is maintained within zooming range independent of input signal frequency, ensuring the zooming function is not limited by an OSR value of the dynamic-zoom ADC. Further details of the ADC circuit 12 incorporating the flash ADC and the passive delta-sigma modulator are described with respect to FIGS. 3-6.

Figure 3:
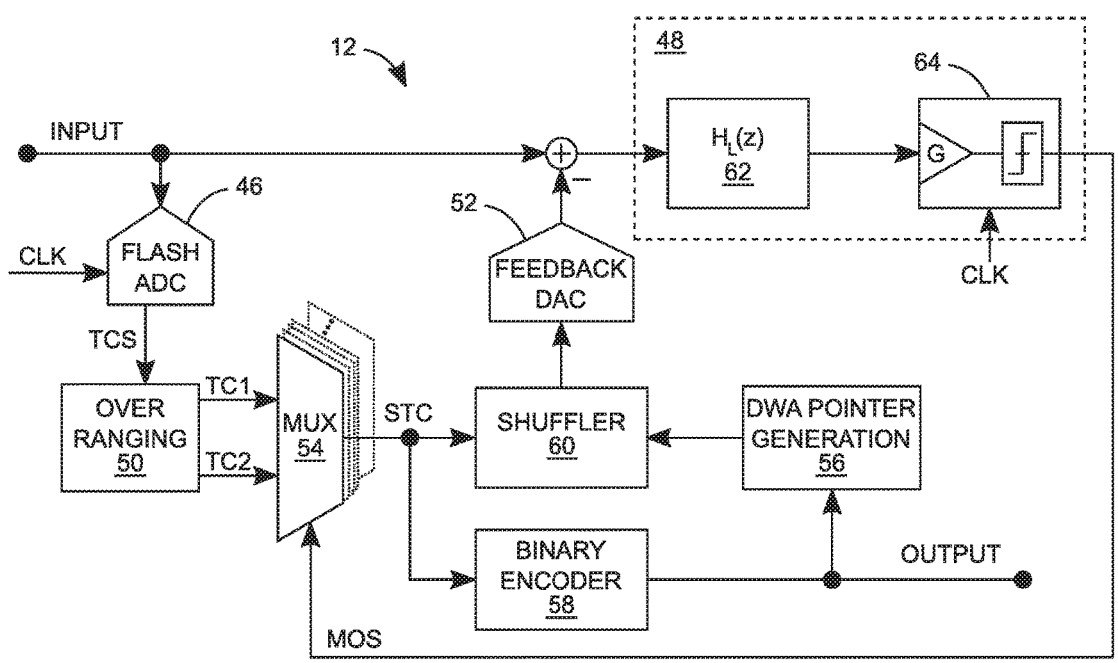
FIG. 3 depicts a schematic diagram of the exemplary ADC circuit of FIG. 1, a dynamic-zoom ADC circuit incorporating a flash ADC providing a coarse digital conversion and a passive delta-sigma modulator providing a fine digital conversion.

FIG. 3 depicts a schematic diagram of the exemplary ADC circuit of FIG. 1, a dynamic-zoom ADC circuit 12 incorporating a flash ADC 46 providing a coarse digital conversion and a passive delta-sigma modulator 48 (e.g., delta-sigma ADC) providing a fine digital conversion. The flash ADC 46 receives an analog input signal INPUT and, at a positive clock edge of a clock signal CLK, the flash ADC 46 outputs a coarse digital conversion. In an exemplary aspect, the flash ADC 46 can be a five bit interpolating flash ADC, though this is not required. The coarse digital conversion of the flash ADC 46 may output a thermometer code signal TCS having an appropriate number of bits according to a target resolution. In an exemplary aspect, the thermometer code signal TCS is a thirty-one bit thermometer code.

During the same clock phase of the clock signal CLK, over-ranging circuitry 50 (e.g., digital logic circuitry) provides two sets of driving options for a feedback DAC 52, a first thermometer code TC1 and a second thermometer code TC2. The feedback DAC 52 may be a multi-bit feedback DAC 52 (e.g., a five-bit DAC based on the bit size of the flash ADC 46 and/or the number of bits of the thermometer code signal TCS) which provides a negative feedback to an input of the delta-sigma modulator 48. At a subsequent negative clock edge of the clock signal CLK, a multiplexer 54 receives a modulator output signal MOS from the concurrently-running delta-sigma modulator 48 and, based on the modulator output signal MOS, selects between the first thermometer code TC1 and the second thermometer code TC2 to drive the feedback DAC 52, which completes one cycle of operation. In some examples, the multiplexer 54 may be implemented as a plurality of multiplexers 54 (e.g., matching the number of bits of the thermometer codes TC1, TC2 and the feedback DAC 52).

Unlike a SAR ADC, the flash ADC 46 requires only one clock cycle to measure the analog input signal INPUT and to update feedback DAC 52 values. In this manner, the input of the delta-sigma modulator 48 receives the analog input signal INPUT along with the feedback DAC 52 values which are updated every clock cycle of the clock signal CLK. Therefore, the analog input signal INPUT is maintained within zooming range independent of input signal frequency, ensuring the zooming technique of the dynamic-zoom ADC circuit 12 is not limited by OSR value. The flash ADC 46 also facilitates using the multi-bit feedback DAC 52 for the passive delta-sigma modulator 48 and reducing quantization noise significantly. Accordingly, the architecture of the dynamic-zoom ADC circuit 12 can be used in the RF communications device 10 of FIG. 1 to operate in multiple modes (e.g., a wider bandwidth) and support lower OSR values required for higher bandwidth modes.

As described above, the flash ADC 46 provides the thermometer code signal TCS, which can be characterized with a thermometer code output value, n, which is equal to a total number of logic high bits. In order to reduce flash ADC 46 non-idealities, the over-ranging circuitry 50 takes the thirty-one bit thermal output code and detects the last logic high bit, n, and prepares the first thermometer code TC1 (e.g., n−2) and the second thermometer code TC2 (e.g., n+2), and stores the thermometer codes TC1, TC2 in two sets of register blocks. As an example, the first thermometer code TC1 (e.g., n−2) can be generated by flipping the last two bits before the nth bit in the thermometer code sequence. Similarly, the second thermometer code TC2 (e.g., n+2), can be generated by flipping the next two bits after the nth bit in the thermometer code. Depending on the modulator output signal MOS from the delta-sigma modulator 48, the multiplexer 54 selects the first thermometer code TC1 or the second thermometer code TC2 to produce a selected thermometer code STC to drive the feedback DAC 52. Alternatively, the over-ranging operation can be conducted after the modulator output signal MOS is decided in order to compute a single thermometer code to drive the feedback DAC 52. However, this may add loop delay, affecting loop stability and limiting the maximum sampling frequency of the dynamic-zoom ADC circuit 12. The over-ranging circuitry 50 can facilitate relaxed flash ADC 46 accuracy requirements and ensure that the analog input signal INPUT is always in the zooming range.

The over-ranging circuitry 50 can also ensure that the linearity of the dynamic-zoom ADC circuit 12 is only limited by the linearity of the delta-sigma modulator 48. Hence, the linearity of the delta-sigma modulator 48 is primarily determined by the nonlinearity of the feedback DAC 52. In order to reduce the non-linearity of the feedback DAC 52, a data weighted averaging (DWA) pointer generation circuit 56 is used. The DWA pointer generation circuit 56 receives the selected thermometer code STC (e.g., after a binary encoder 58 converts the selected thermometer code STC to a binary digital output signal OUTPUT) and works in cooperation with a shuffler circuit 60 to average out non-linearities of the feedback DAC 52.

As described above, the delta-sigma modulator 48 (e.g., the delta-sigma ADC) provides a fine digital conversion at the modulator output signal MOS based on the analog input signal INPUT and a negative feedback from the feedback DAC 52. The delta-sigma modulator 48 includes a passive loop filter 62 and a single-bit quantizer 64, which may be or include a programmable comparator. The loop filter 62 can include one or more passive integrators which operate according to a transfer function $H_L(z)$ (e.g., similar to the transfer function $H_L(z)$ of the loop filter 38 of FIG. 2), which in an exemplary embodiment is a second-order transfer function, the loop filter 62 including two integrators. In other examples, the loop filter 62 can be a different order filter. Due to the use of passive integrators, the passive loop filter 62 does not provide any gain, significantly attenuating voltage swing at an output of the loop filter 62. Instead, the required gain is provided in the quantizer 64 through use of the programmable comparator. Based on the modulator output signal MOS from the delta-sigma modulator 48, the multiplexer 54 selects the first thermometer code TC1 or the second thermometer code TC2 to produce the selected thermometer code STC. The binary encoder 58 converts the selected thermometer code STC to the binary digital output signal OUTPUT.

The dynamic-zoom ADC circuit 12 provides a DT, passive delta-sigma modulator 48 based solution for multi-mode RF applications by employing a coarse flash ADC 46 zooming unit which facilitates the use of the multi-bit feedback DAC 52. The dynamic-zoom ADC circuit 12 can satisfy multiple communications standards (e.g., RF bandwidths), such as 3GPP GSM/EDGE, UMTS, and LTE (e.g., between 100 kHz and 10 MHz) while providing a higher resolution (e.g., thirteen point five (13.5) bits to eleven (11) bits of resolution) digital output signal OUTPUT. The dynamic-zoom ADC circuit 12 can be implemented with an appropriate semiconductor technology, such as 130 nm technology. Due to the single clock cycle operation of the flash ADC 46 zooming unit and the feedback DAC 52, the zooming technique of the dynamic-zoom ADC circuit 12 is not limited by the OSR value of the delta-sigma modulator 48. In other words, the dynamic-zoom ADC circuit 12 is not limited by maximum available clock frequency or higher bandwidth of the analog input signal INPUT.

In an exemplary aspect, a z-domain NTF of the dynamic-zoom ADC circuit 12 is constant regardless of communications standard (e.g., signal bandwidth) selection. The signal bandwidth scales with the sampling frequency, and multi-bandwidth operation is realized by changing clock frequencies (e.g., a frequency of the clock signal CLK) based upon the communications standard. For example, in an EDGE mode, the frequency of the clock signal CLK is set to 26 MHz. In a UMTS mode the frequency of the clock signal CLK is set to 245.8 MHz. In a 5-MHz LTE mode, the frequency of the clock signal CLK is set to 480 MHz, and in a 10-MHz LTE mode, the frequency of the clock signal CLK is set to 640 MHz. The quantizer 64 includes a programmable comparator to enable different noise and sampling frequency requirements per mode. Energy scalability and sampling frequency change are also satisfied with the programmable comparator.

Figure 4:
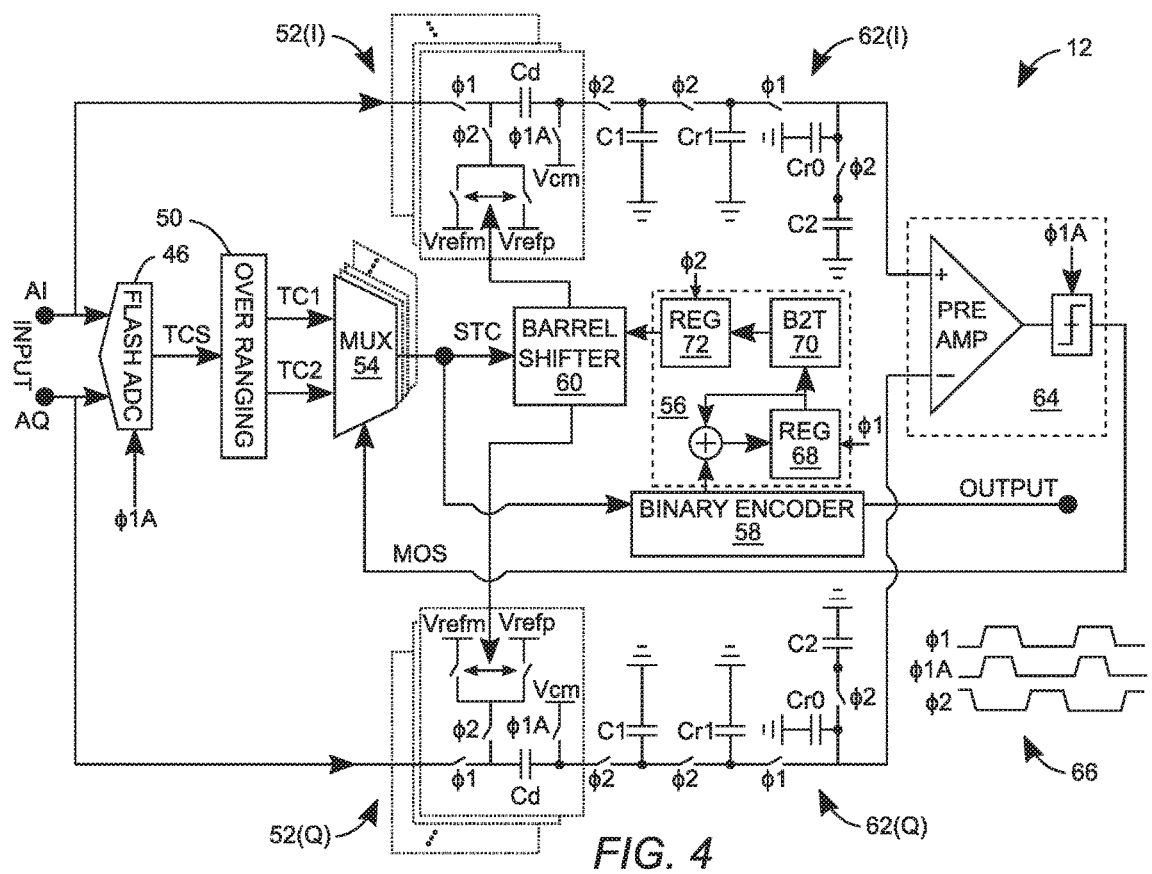
FIG. 4 depicts a schematic diagram of the exemplary ADC circuit of FIG. 1, a dynamic-zoom ADC circuit implemented with top level switched capacitors.

FIG. 4 depicts a schematic diagram of the exemplary ADC circuit of FIG. 1, a dynamic-zoom ADC circuit 12 implemented with top level switched capacitors. The dynamic-zoom ADC circuit 12 can operate with multiple clock signals, as illustrated in a relative timing diagram 66 of FIG. 4, including a first clock signal φ1, a first alternate clock signal φ1A (e.g., the clock signal CLK of FIG. 3), and a second clock signal φ2. The first clock signal φ1 can be a first clock phase and the second clock signal φ2 can be a second, non-overlapping clock phase. A programmable two phase clock generation circuit can be used to adjust non-overlap time based on the sampling frequency of the dynamic-zoom ADC circuit 12. In order to decrease signal-dependent charge injection errors, bottom plate sampling can be used during sampling.

In some examples, the analog input signal INPUT to the dynamic-zoom ADC circuit 12 includes multiple inputs, such as the analog in-phase signal AI of FIG. 1 and the analog quadrature signal AQ of FIG. 1. The dynamic-zoom ADC circuit 12 converts the analog in-phase signal AI and the analog quadrature signal AQ into the digital output signal OUTPUT, which may be a demodulated digital output signal. In this regard, the flash ADC 46 receives the analog in-phase signal AI and the analog quadrature signal AQ and outputs the thermometer code signal TCS in a manner as described above with respect to FIG. 3, and as further depicted in FIG. 6 below. One input terminal of the quantizer 64 is coupled to a first loop filter 62(I), which is further coupled to the analog in-phase signal AI and a first feedback DAC 52(I). Another input terminal of the quantizer 64 is coupled to a second, parallel loop filter 62(Q), which is further coupled to the analog quadrature signal AQ and a second, parallel feedback DAC 52(Q). The quantizer 64 and the first and second loop filters 62(I), 62(Q) can form the delta-sigma modulator 48 of FIG. 3 (e.g., the delta-sigma ADC). In an exemplary aspect, each of the first feedback DAC 52(I) and the second feedback DAC 52(Q) is a multi-bit feedback DAC, with a plurality of the feedback DAC circuits shown according to the number of bits (e.g., in accordance with the bits of the selected thermometer code STC).

In each feedback DAC 52(I), 52(Q), a capacitor Cd is shared between the input sampling and the feedback paths. Therefore, the capacitor Cd is used to perform the feedback DAC 52(I), 52(Q) functionality as well. In this manner, the dynamic-zoom ADC circuit 12 can consume a reduced amount of power by using capacitors that are half as large as the capacitors of an ADC circuit with a separate capacitor for the feedback DAC. The capacitor Cd in the feedback DACs 52(I), 52(Q) and capacitors C1, Cr1, Cr0, and C2 in the loop filters 62(I), 62(Q) can be selected according to performance requirements, such as dynamic range and linearity. For example, the capacitor Cd can be 60 fF, the capacitors C1 and C2 can be 60 pF, the capacitor Cr1 can be 1.86 pF, and the capacitor Cr0 can be 12 pF. In some examples, metal-insulator-metal (MIM) capacitors are used for area efficiency.

The feedback DACs 52(I), 52(Q) and the loop filters 62(I), 62(Q) include switches as depicted in FIG. 4, which can be implemented with transmission gates (TGs). The switch sizes can be optimized to yield small enough on resistance (Ron) to work properly at the maximum clock frequency supported by the dynamic-zoom ADC circuit 12. The capacitor Cr1 should sample from the capacitor C1 according to the second clock signal ϕ2, and the quantizer 64 (e.g., programmable comparator) should generate a valid modulator output signal MOS before the next cycle of the second clock signal ϕ2 to limit the overall loop delay to a one clock cycle. Any additional delay inside the feedback loop will degrade performance of the dynamic-zoom ADC circuit 12. This may limit the maximum sampling rate of the dynamic-zoom ADC circuit 12 (e.g., to 640 MHz for a 130 nm process). In order to minimize the feedback loop delay, the DWA pointer generation circuit 56 is placed outside the loop and the shuffler circuit 60 of FIG. 3 can use a barrel shifter circuit 60 instead of a logarithmic shifter.

In an exemplary aspect, a three bit quantized DWA (Qu-DWA) is used instead of a five bit DWA for the pointer generation circuit 56. The Qu-DWA pointer generation circuit 56 can receive a five bit output signal OUTPUT from the binary encoder 58, and use a first register 68 (which may be triggered by the first clock signal ϕ1) and a truncated adder to provide the most significant three bits of the output signal OUTPUT to a binary to thermal encoder (B2T) 70. A second register 72 (which may be triggered by the second clock signal ϕ2) coupled to the B2T 70 provides a total number of shifts from the current starting point of the feedback DACs 52(I), 52(Q). Using a three bit Qu-DWA can decrease complexity and power consumption of the pointer generation circuit 56. In addition, the barrel shifter circuit 60 can use less switches (e.g., two hundred seventeen switches instead of nine hundred sixty one switches) and save area and power.

Design requirements for the quantizer 64 (e.g., comparator) are different for different modes. The programmable single-bit quantizer 64 of the dynamic-zoom ADC circuit 12 can support different sampling frequency and noise requirements with lower power consumption while keeping the preamplifier gain within an acceptable range.

Figure 5:
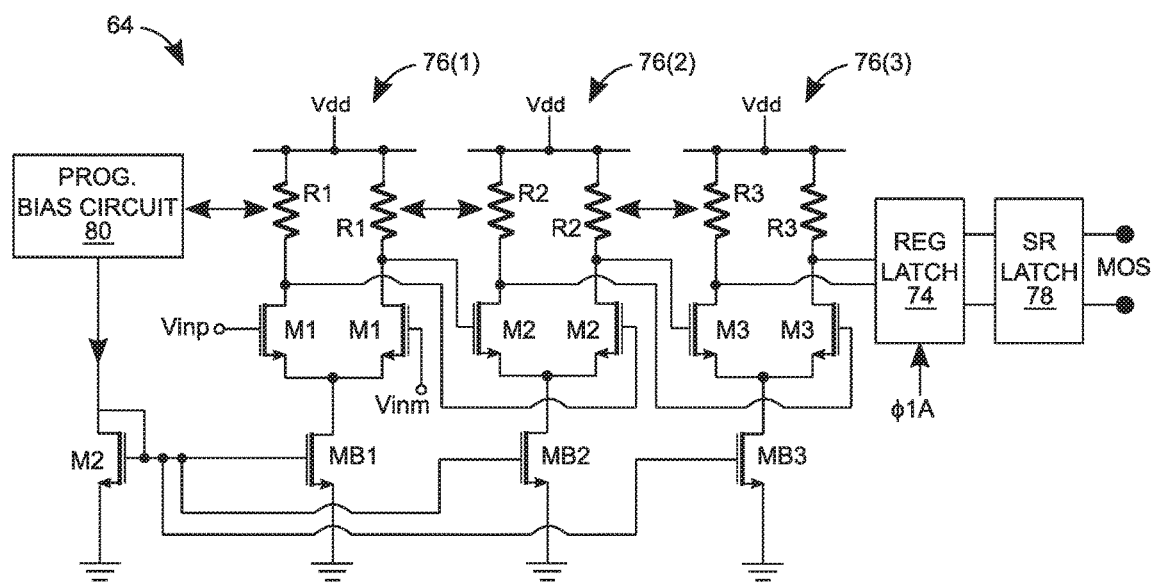
FIG. 5 depicts an exemplary single-bit quantizer of the ADC circuit in FIGS. 1, 3, and 4.

FIG. 5 depicts an exemplary single-bit quantizer 64 of the dynamic-zoom ADC circuit 12 in FIGS. 1, 3, and 4. As depicted in FIG. 5, the quantizer 64 can include a regenerative latch 74 preceded by three preamplifier stages 76(1)-76(3). In some examples, an SR latch 78 is coupled to the regenerative latch 74 and provides the modulator output signal MOS to the dynamic-zoom ADC circuit 12. A programmable bias circuit 80 provides reconfigurable bias currents and resistive loads to adapt the performance of the preamplifier stages 76(1)-76(3) to the noise and bandwidth requirements of each mode. An input signal to the quantizer 64 is amplified by the preamplifier stages 76(1)-76(3) during the first clock signal ϕ1. Regeneration operation starts at the falling edge of the first alternate clock signal ϕ1A and the logic level is decided. The valid modulator output signal MOS is made available before the beginning of the second clock signal ϕ2 to avoid glitches.

Figure 6:
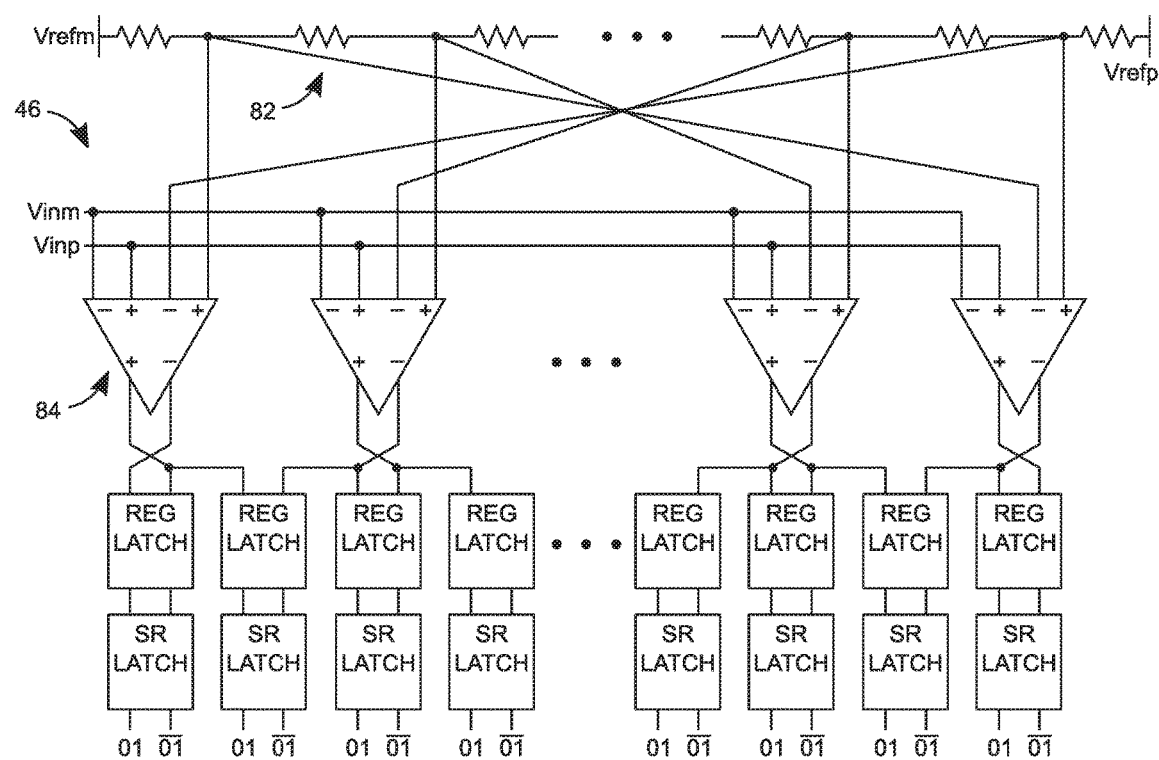
FIG. 6 depicts an exemplary flash ADC of the ADC circuit in FIGS. 1, 3, and 4.

FIG. 6 depicts an exemplary flash ADC 46 of the dynamic-zoom ADC circuit 12 in FIGS. 1, 3, and 4. As depicted in FIG. 6, the flash ADC 46 may be a full differential interpolating flash ADC, and may serve as a zooming unit for the dynamic-zoom ADC circuit. The flash ADC 46 in this example employs a resistive ladder DAC 82 and single stage preamplifier based comparators 84. The preamplifier based comparators 84 can suppress offset and kickback noise present in dynamic comparators. The operation of the interpolating flash ADC 46 is similar to other flash ADCs, but reduces the number of the preamplifier based comparators 84. Accordingly, the power consumption of the flash ADC 46 can be decreased while keeping a voltage offset within an acceptable margin. In some cases, the flash ADC 46 uses an interpolating flash ADC with a 2× interpolating factor as presented in FIG. 4. The preamplifier based comparators 84 can be sized to maintain a DC offset less than 0.25 least significant bit (LSB). In other aspects, the flash ADC 46 may not be an interpolating flash ADC, or may have a higher or lower interpolating factor.

Those skilled in the art will recognize improvements and modifications to the preferred embodiments of the present disclosure. All such improvements and modifications are considered within the scope of the concepts disclosed herein and the claims that follow.

What is claimed is:

1. An analog to digital converter (ADC) circuit, comprising:
a first analog input node;
a flash ADC coupled to the first analog input node;
a feedback digital to analog converter (DAC) coupled to an output of the flash ADC;
a passive delta-sigma ADC coupled to the first analog input node and coupled to an output of the feedback DAC;
an over ranging circuit coupled to the output of the flash ADC and configured to provide a first coarse digital signal and a second coarse digital signal;
a multiplexer coupled to the output of the flash ADC and coupled to an output of the delta-sigma ADC; and
a digital output node coupled to an output of the multiplexer.

2. The ADC circuit of claim 1, wherein:
the flash ADC comprises an interpolating flash ADC; and
the output of the flash ADC comprises a thermometer code.

3. The ADC circuit of claim 2, further comprising a thermal to binary encoder configured to provide a binary digital output signal to the digital output node based on the thermometer code and the output of the delta-sigma ADC.

4. The ADC circuit of claim 1, wherein:
the multiplexer is coupled between the over ranging circuit and the feedback DAC; and
the output of the delta-sigma ADC causes the multiplexer to select between the first coarse digital signal and the second coarse digital signal.

5. The ADC circuit of claim 1, further comprising a loop filter coupled between the first analog input node and the delta-sigma ADC and configured to provide an analog input to the delta-sigma ADC.

6. The ADC circuit of claim 5, wherein the loop filter comprises a second order loop filter.

7. The ADC circuit of claim 5, wherein the delta-sigma ADC comprises a programmable comparator.

8. The ADC circuit of claim 1, further comprising a second analog input node configured to receive an in-phase modulated signal;
wherein:
the first analog input node is configured to receive a quadrature modulated signal;

the flash ADC is further coupled to the second analog input node; and the delta-sigma ADC is further coupled to the second analog input node.

9. The ADC circuit of claim 8, further comprising a binary encoder coupled to the output of the flash ADC and coupled to the output of the delta-sigma ADC;

wherein the binary encoder is configured to provide a demodulated binary digital output signal to the digital output node.

10. A circuit, comprising:

a flash analog to digital converter (ADC) configured to convert an analog input signal to a coarse digital signal;

a passive delta-sigma ADC comprising a programmable comparator and configured to provide a fine digital signal; and a feedback digital to analog converter (DAC) coupled between the flash ADC and an input of the delta-sigma ADC and configured to reduce a quantization noise in the fine digital signal based on the coarse digital signal.

11. The circuit of claim 10, wherein the circuit is configured to provide an output signal at an output node based on the coarse digital signal and the fine digital signal.

12. The circuit of claim 10, wherein the programmable comparator is configured to adjust between sampling frequency requirements based on a radio frequency (RF) band of the analog input signal.

13. The circuit of claim 10, forming part of a radio frequency (RF) receive path coupled to an RF antenna.

14. The circuit of claim 13, wherein:

the analog input signal comprises an in-phase modulated signal and a quadrature modulated signal; and the circuit provides a demodulated digital output signal based on the in-phase modulated signal and the quadrature modulated signal.

15. A method for converting an analog input signal to a digital output signal, comprising:

receiving the analog input signal;

converting the analog input signal to a coarse digital signal through a flash analog to digital converter (ADC) circuit;

converting the analog input signal to a quantized digital signal through a passive delta-sigma ADC circuit;

providing a feedback signal based on the coarse digital signal and the quantized digital signal; and providing the digital output signal based on the coarse digital signal and the quantized digital signal.

16. The method of claim 15, wherein converting the analog input signal to the coarse digital signal further comprises:

providing a first over ranging digital signal based on an output of the flash ADC circuit;

providing a second over ranging digital signal based on the output of the flash ADC circuit; and multiplexing the first over ranging digital signal and the second over-ranging digital signal to provide the coarse digital signal.

17. The method of claim 16, wherein providing the feedback signal comprises converting the coarse digital signal to an analog feedback signal to be removed from an input to the delta-sigma ADC circuit.

18. The method of claim 15, further comprising adjusting the quantized digital signal based on a radio frequency (RF) band of the analog input signal.

19. The method of claim 16, wherein providing the digital output signal based on the coarse digital signal and the quantized digital signal comprises multiplexing at least the first over ranging digital signal and the second over-ranging digital using the quantized digital signal as a selector.

20. The circuit of claim 10, wherein the passive delta-sigma ADC further comprises a passive second-order loop filter configured to provide a filtered analog input signal to the programmable comparator.

* * * * *